United States Patent [19]

Suzuki

[11] 4,035,824
[45] July 12, 1977

[54] SEMICONDUCTOR DEVICE STABILIZED BY AN INSULATING LAYER FORMED ON A SEMICONDUCTOR REGION HAVING A LOW IMPURITY CONCENTRATION

[75] Inventor: Kunizo Suzuki, Tokyo, Japan

[73] Assignee: Sony Corporation, Tokyo, Japan

[21] Appl. No.: 567,274

[22] Filed: Apr. 11, 1975

[30] Foreign Application Priority Data

Apr. 18, 1974 Japan .................... 49-43790

[51] Int. Cl.² ............... H01L 29/72; H01L 29/40; H01L 27/02; H01L 29/00
[52] U.S. Cl. ........................... 357/34; 357/37; 357/40; 357/43; 357/53; 357/88; 357/89; 357/90
[58] Field of Search ............ 357/34, 37, 40, 43, 357/89, 88, 90

[56] References Cited

U.S. PATENT DOCUMENTS 3,663,869 5/1972 Strull .......................... 357/43

FOREIGN PATENT DOCUMENTS 2,130,399 3/1972 France ........................ 357/34

*Primary Examiner*—Edward J. Wojciechowicz
*Attorney, Agent, or Firm*—Hill, Gross, Simpson, Van Santen, Steadman, Chiara & Simpson

[57] ABSTRACT

A semiconductor device such as a transistor, has a heavily doped emitter, a lightly doped emitter, a base, a collector, an insulating layer covering the lightly doped emitter and a conductive layer extending on the insulating layer covering an L - H junction which is formed by the lightly doped and heavily doped emitters.

The L-H junction and the insulating layer is located at the distance from an emitter-base junction within the diffusion length of minority carriers in the lightly doped emitter.

The above insulating layer is formed before the forming of the heavily doped emitter so that the surface recombination velocity in the emitter is reduced.

7 Claims, 22 Drawing Figures

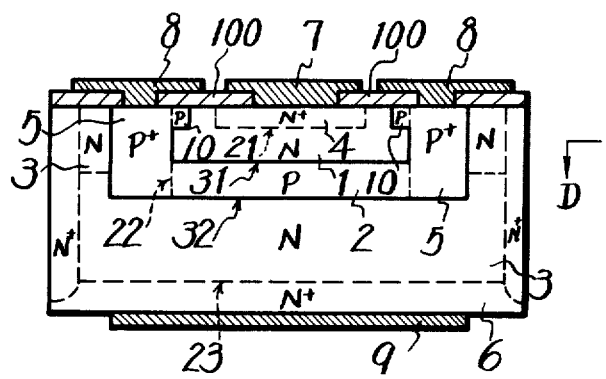
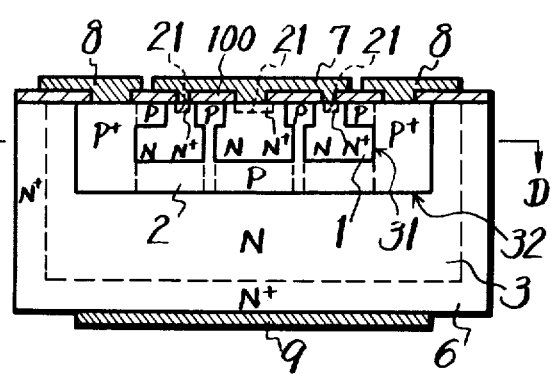
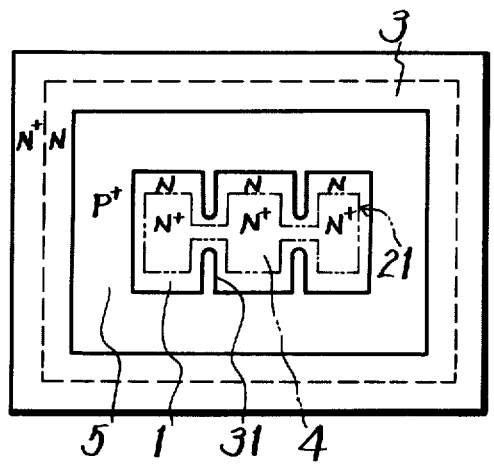
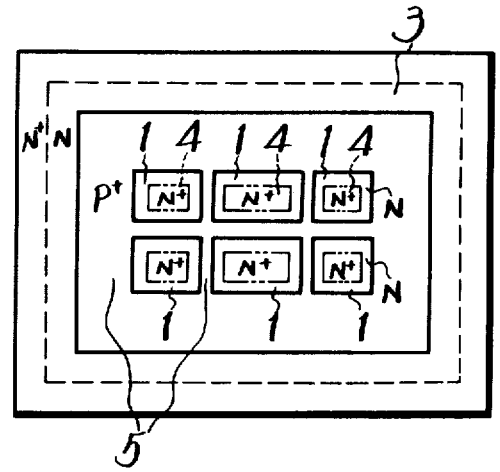
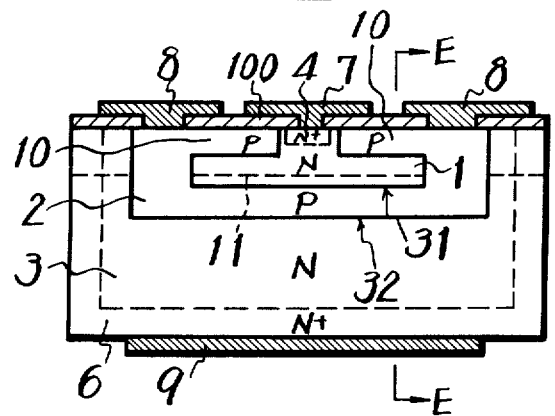
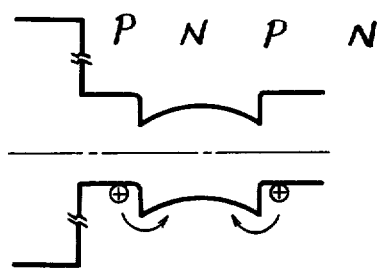

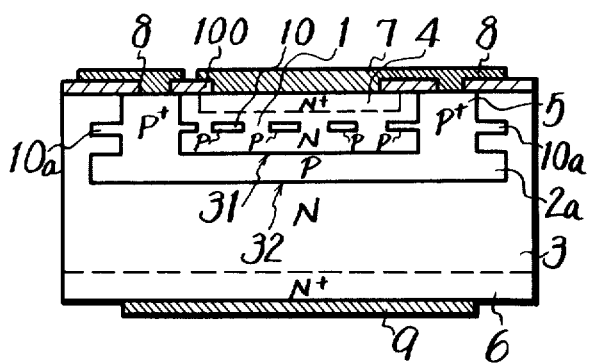
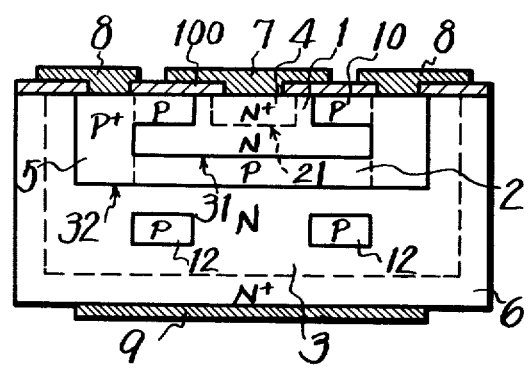
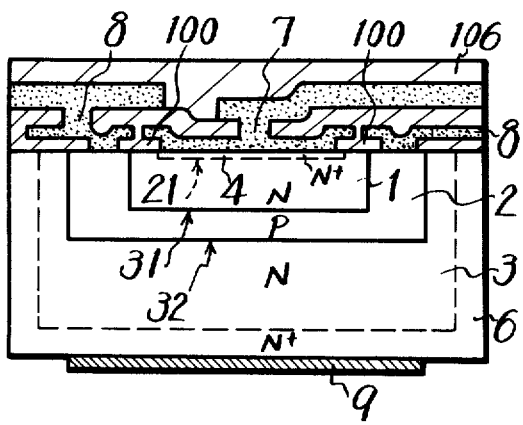
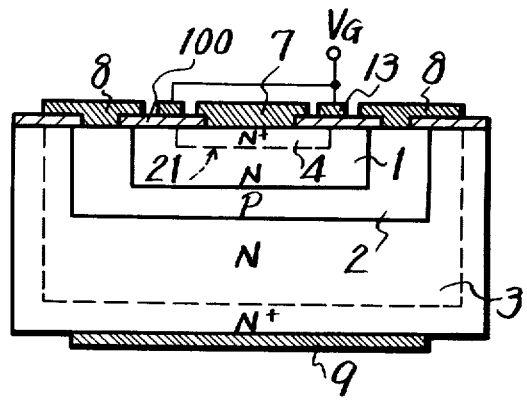
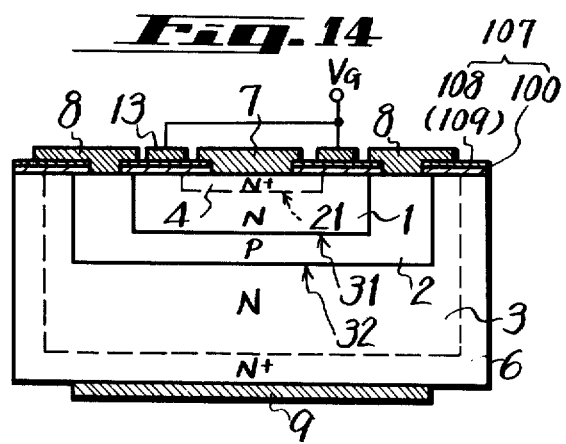

SEMICONDUCTOR DEVICE STABILIZED BY AN INSULATING LAYER FORMED ON A SEMICONDUCTOR REGION HAVING A LOW IMPURITY CONCENTRATION

BACKGROUND OF THE INVENTION

1. Field of the Invention

This invention relates generally to a semiconductor device, and more particularly to a transistor in which a diffusion length of minority carriers in an emitter region is larger than that of conventional transistors.

Such transistors were described in patent applications of Hajime Yagi and Tadaharu Tsuyuki, Ser. No. 427,647 and 427,648 filed Dec. 26, 1973, assigned to the same assignee as this application.

In one of the above patent applications, Ser. No. 427,648, the built-in-field located in the emitter region is specified. In the other patent application, Ser. No. 427,647, the re-injection source region and other special means formed adjacent the emitter region are specified.

2. Description of the Prior Art

The emitter region of the transistor is generally formed by heavy doping of impurity material into a semiconductor material, and the diffusion length of minority carriers therein is very small in comparison with a width of the emitter region.

Some of the prior arts show transistors having a lightly doped emitter region therein. For example, U.S. Pat. Nos. 2,822,310, 3,500,141, 3,591,430 and French Patent Publication No. 2,130,399.

SUMMARY OF THE INVENTION

This invention provides a transistor in which the carrier diffusion length in the emitter region thereof is enlarged by a surface insulating layer covering the lightly doped emitter region.

It is an object of this invention to provide an improved transistor having a high current amplification factor $hFE$.

It is the second object of this invention to provide an improved transistor having a current amplification factor $hFE$ controlable over a wide range.

It is the third object of this invention to provide an improved transistor having a reduced crystal strain or dislocation near an emitter-base junction and having low noise characteristics.

It is the fourth object of this invention to provide an improved transistor in which a current flowing from the emitter through the base to the collector has a substantially parallel direction and causes the transfer time of carriers to be minimized.

It is the fifth object of this invention to provide an improved transistor having a high power characteristics and a high reliability.

It is the sixth object of this invention to provide an improved transistor which is easily fabricated in a part of integrated circuits.

It is the seventh object of this invention to provide an transistor which has a capability to modify and obtain various type of semiconductor devices.

It is the eighth object of this invention to reduce the surface recombination velocity at the surface of the lightly doped emitter region.

It is the ninth object of this invention to reduce the influence of the electric field formed adjacent the outside of the lightly doped emitter region.

The other objects, features and advantages of this invention will become aapparent from the following description taken in conjunction with the accompanying drawings in which like reference numerals designate like elements.

FIGS. from 2 to 4 are respectively partial cross sections of the second, third and fourth embodiments of this invention respectively.

FIGS. 5 and 6 are cross sections of the fifth and sixth embodiments of this invention respectively.

FIGS. 7 and 8 are plane views of the seventh and eighth embodiments of this invention respectively.

FIGS. from 9 to 18 are cross sections of from ninth to 18th embodiments of this invention respectively.

FIG. 9E is an energy level diagram for explanation of the device shown in FIG. 9.

DESCRIPTION OF THE PREFERRED EMBODIMENTS

EXAMPLE 1

Figure 1:
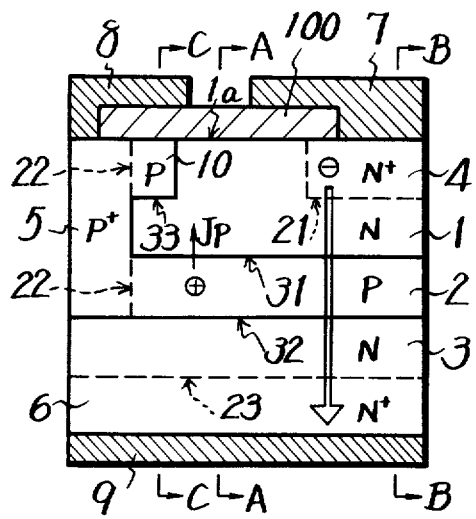
FIG. 1 is a cross section of an embodiment of the semiconductor device according to this invention.

Referring to FIG. 1, there is shown one embodiment of the invention in which provided is a transistor having three semiconductor regions of alternately different conductivity types forming two PN junctions. In the following explanation, embodiments are NPN type transistors, however, PNP type transistors are explained in the similar way exchanging the conductivity types thereof.

FIG. 1 shows a cross section of a bipolar transistor, which includes a lightly doped emitter 1 of the N conductivity type silicon having an impurity concentration lower than $10^{19}$ atoms/cm$^3$, a lightly doped base 2 of P conductivity type silicon having an impurity concentration lower than $10^{19}$ atoms/cm$^3$ and a lightly doped collector 3 of N conductivity type silicon. The first PN junction, that is to say, an emitter junction 31 is formed between the emitter (first) region 1 and the base (second) region 2, while the second PN junction, that is to say, a collector junction 32 is formed between the base (second) region 2 and the collector (third) region 3.

Three heavily doped regions 4, 5 and 6 for the emitter, base and collector are located forming three L-H (lightly doped - heavily doped) junctions 21, 22 and 23 with three lightly doped regions 1, 2 and 3 respectively. An insulating layer 100 such as silicon-dioxide (SiO$_2$) covers the entire surface 1a of the lightly doped emitter 1, a part of the heavily doped emitter 4 and a part of the heavily doped base 5. An emitter electrode 7 is formed so as to make electrical contact with the heavily doped emitter 4, extending on the insulating layer 100 and covering entire L-H junction 21. A base electrode 8 is formed ohmically contacting with the heavily doped base 5, extending on the insulating layer 100 and covering the entire surface part of the emitter-base junction 31. A collector electrode 9 is formed so as to make electrical contact with the heavily doped collector 6.

The method for fabricating the above transistor comprises the following steps.

The N conductivity type silicon substrate is prepared including lightly doped region 3 and heavily doped region 6. The heavily doped region 6 has an impurity concentration of about $2 \times 10^{20}$ atoms/cm$^3$ at the surface, and the lightly doped region 3 has an impurity concentration of about $3 \times 10^{15}$ atoms/cm$^3$. The lightly doped region 3 may be formed by the epitaxial growth technique on the heavily doped region 6 with a thickness of about 10 microns.

The lightly doped base region 2 of P conductivity type is formed by the ion implantation of boron on the surface of the lightly doped collector region 3 using the silicon-dioxide mask. The impurity concentration of the base region 2 is approximately $1 \times 10^{17}$ atoms/cm$^3$, and the thickness thereof is 2 microns. The energy of the implantation is about 55 KeV.

After the annealing of the substrate, the lightly doped N-type layer 1 is formed by the second epitaxial growth on the substrate. The impurity concentration of the layer 1 is $3 \times 10^{15}$ atoms/cm$^3$ and the thickness thereof is 10 microns.

The insulating layer 100 is formed by the thermal oxidation of the epitaxial layer 1 under the condition of the stream, oxygen gas and the temperature of about 1100° C. The thickness of the insulating layer 100 is approximately 1 micron. Then, the heavily doped base 5 is diffused through the opening formed in the insulating layer 100 by the well known selective diffusion method.

The additional region 10 of P conductivity type is formed by the selective diffusion method through the other opening of the insulating layer 100. The surface impurity concentration of the region 10 is $10^{18}$ atoms/cm$^3$. The additional region 10 is located near and touching with the heavily doped base 5, forming the L-H junction 22 therewith. A new oxidized layer is formed on the surface of P type regions 5 and 10.

The heavily doped emitter 4 of N conductivity type is formed by the selective diffusion method through the opening opened in the insulating layer 100. The surface impurity concentration of the region 4 is $2 \times 10^{20}$ atoms/cm$^3$. The diffusion depth of the region 4 is 3 microns. The heavily doped emitter 4 forms the L-H junction 20 with the lightly doped epitaxial emitter 1.

The insulating layer 100 is left on the surface of the semiconductor layer covering the entire surface of the lightly doped emitter 1, a part of the heavily doped emitter 4, the entire surface of the additional region 10 and a part of heavily doped base 5.

The metal electrodes 7, 8 and 9 are formed by the evaporation method.

With the above transistor of this invention, the PN junction 31 between the emitter region 1 and the base region 2 is biased forwardly and the PN junction 32 between the base region 2 and the collector region 3 is biased reversely to achieve the amplifying operation, or the PN junctions 31 and 32 are biased reversely or forwardly to achieve the switching operation. During such operations, a main current or electron current $J_n$ flows from the emitter region 1 to the collector region 3. At this time, the electrons are major carriers in the emitter region 1 and the collector region 3 but minority carries in the base region 2. On the forwardly biased emitter junction 31, the hole current $J_p$ from the base region 2 to the emitter region 1 must be considered in addition to the electron current $J_n$. As the ratio of both the currents $Jp/Jn$ is small, the emitter injection efficiency becomes high and hence the current amplification factor of the transistor which is represented as $\alpha$ or $h_{FE}$ is increased.

The constructional conditions of this invention which are common to all the embodiments described later are as follows:

1-1. The emitter region 1 of epitaxial growth layer having the impurity concentration lower than $10^{19}$ atoms/cm$^3$ must be presented.

1-2. The base region 2 being lower than $10^{19}$ atoms/cm$^3$ in impurity concentration must be presented.

1-3. The collector region 3 being lower than $10^{19}$ atoms/cm$^3$ in impurity concentration must be presented.

1-4. There must be provided three regions 4, 5 and 6 which form the L-H junctions 21, 22 and 23 with the emitter region 1, the base region 2 and the collector region 3, respectively, are the same in conductivity type as those of the regions 1, 2 and 3, respectively and high in impurity concentrations as compared with the regions 1, 2 and 3, respectively. In this case, the L-H junctions or at least the L-H junction 21 must have the potential barrier higher than the energy of the minority carrier (hole) or at least the thermal energy. The thermal energy represents the mean value of energy determined by the temperature and is the product of $k \times T$ where $k$ is the Boltzman's constant and T is the absolute temperature. This level difference (the height of potential barrier) is desired to be more than 0.1 eV.

1-5. The distance from the PN junction 31 formed by the emitter region 1 and the base region 2 to the surface 1a of the emitter region 1 which faces the major surface of the semiconductor substrate is smaller than the diffusion length of the minority carriers (holes) in the emitter region 1. In other words, the distance between the PN junction 31 and the surface 1a is selected smaller than the diffusion length of the minority carriers in the emitter region 1.

1-6. The surface 1a of the emitter region 1 which faces the major surface of the semiconductor substrate is covered with the insulating layer 100 which is formed after the epitaxial growth of the emitter region 1 but before the L-H junction 21 being formed.

Figure 1A:
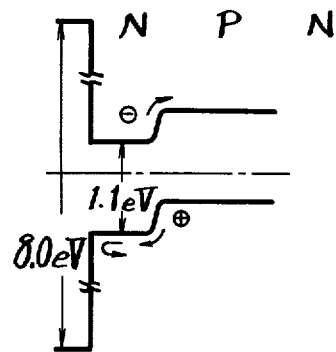
FIGS. 1A, 1B and 1C are respectively energy level diagrams for explanation of the semiconductor device shown in FIG. 1.

The current amplification factor $h_{FE}$ of this transistor is increased by the above construction. That is, the holes injected from the base region 2 to the emitter region 1 are long in life due to the fact that the emitter region 1 is low in impurity concentration, the crystal property thereof is superior and so on, and the diffusion length of the holes in the emitter region 1 becomes long. Thus, the emitter injection efficiency can be increased. Further, as shown in FIG. 1A which is an energy level diagram along the line A—A in FIG. 1, the hole current $J_p$ injected from the P type base region 2 to the N type emitter region 1 enters the valence band of the N type emitter but can not enter the clean insulating layer 100, and the ratio of the recombination on the surface 1a or surface recombination velocity is very low. Accordingly, the hole is prevented from being moved in the left direction in the figure or reflected in the right direction by the electric field, then stored in the emitter region 1 to make the gradient of the carrier density flat. As a result, the hole current $J_p$ becomes zero substantially, the emitter injection efficiency $\gamma$ becomes nearly 1 and hence the current amplification factor $h_{FE}$ may be increased. After the base region 5 of high impurity concentration and the emitter region 4 of high impurity concentration are formed, if the cover which is used as a diffusion mask is removed and the insulating layer 100 is exchanged, the surface recombination velocity increases. Further, since the PN junction 31 is formed of the layer of impurity concentration lower than $10^{19}$ atoms/cm$^3$, the noise characteristics caused by the crystal strain or dislocation can be improved.

The above embodiment of this invention has the following conditions in addition to those 1-1 to 1-6.

1-7. The distance between the L-H junction 21 formed by the emitter region 1 and the high impurity concentration region 4 and the emitter junction 31 is selected smaller than the diffusion length of the minority carriers in the emitter region 1.

1-8. The additional region 10 is formed contiguous to the high impurity concentration region 5 for the base and same in conductivity type with each other. The distance between the additional region 10 and the emitter junction 31 is selected smaller than the diffusion length of the minority carriers in the emitter region 1.

1-9. The insulating layer 100 is SiO$_2$ layer made by thermal oxidization. For example, the epitaxial layer 1 which may become the low impurity concentration emitter region is subjected to heat treatment at about 1100° C in an oxidizing atmosphere to form the insulating layer 100 of SiO$_2$ with the thickness of about 1 micron. Thereafter, an opening is formed through the SiO$_2$ layer 100 by etching method, and the N type high impurity concentration region is formed by diffusion through the opening. Further, if necessary, the additional region 10 of P type is formed by diffusion with the same insulating layer 100 as a mask.

1-10. The width of the low impurity concentration emitter region 1 in its thickness direction is so selected that the width of the low impurity concentration region lower than $10^{19}$ atoms/cm$^3$ is selected larger than 1 micron to avoid the influence of the high impurity concentration region 4 on the emitter junction 31.

Figure 1B:
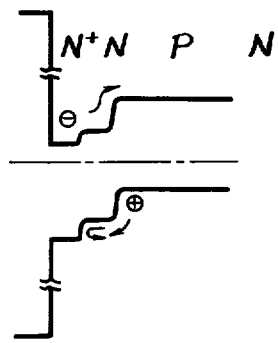

Due to the above condition 1-7, the transition region of potential is formed in the vicinity of the L-H junction 21 in the emitter region 1, and the minority carriers (holes) injected from the base region 2 to the emitter region 1 are prevented or reflected by the transition region (refer to the energy level diagram of FIG. 1B along the line B—B in FIG. 1) to make the hole current $J_p$ in the emitter region 1 approach zero.

Figure 1C:
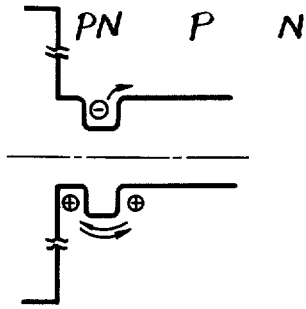

Due to the above condition 1-8, since the diffusion length is great, the holes injected to the emitter region 1 effectively arrive at the P type additional region 10 and are absorbed by the additional region 10. When the additional region 10 is electrically floated, the potential of the additional region 10 increases due to the increase of the holes, and the PN junction 33 formed between the additional region 10 and the emitter region 1 is forwardly biased substantially to a rising up voltage. Thus, the holes are re-injected to the emitter region 1 (refer to the energy level diagram of FIG. 1C along the line C—C in FIG. 1) to make the gradient of the hole density between the junctions 31 and 33 flat, and accordingly the hole current $J_p$ across the emitter junction 31 may become zero due to statistical or equivalent factors, because any hole current component directed from the base to the emitter can be cancelled by another hole current component directed from the emitter to the base.

Due to the above condition 1-9, since the insulating layer 100 is formed after the low impurity concentration emitter region 1 is formed by the epitaxial growth but before the high impurity concentration region 4 is formed, the recombination of the hole on the surface of the semiconductor substrate can be greatly reduced.

EXAMPLE 2

Figure 2:
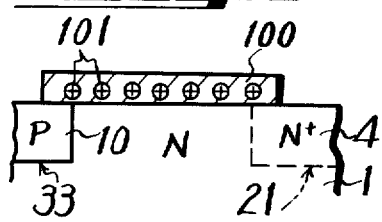

As shown in FIG. 2, this example has the following condition in addition to the above conditions 1-1 to 1-9.

2-1. The insulating layer 100 contains positive ions 101 therein.

This condition is presented by injecting ions or charges into the insulating layer 100 after the respective regions of the transistor are formed, which increases the effect of reflecting the holes injected from the base region 2 to the emitter region 1.

EXAMPLE 3

Figure 3:
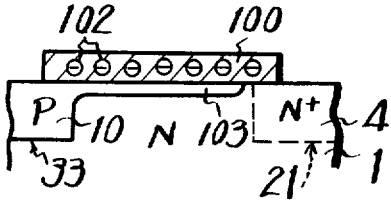

As shown in FIG. 3, this example has the following condition in addition to the above conditions 1-1 to 1-9.

3-1. The insulating layer 100 contains negative ions 102 and an inverse layer 103 is formed on the surface of the N type emitter region 1.

This condition is presented by the ion injection method as in the case of Example 2. In this case, the re-injection of holes is caused by the inverse layer 103 contiguous to the P type additional region 10, and consequently the hole current $J_p$ is made zero.

EXAMPLE 4

Figure 4:
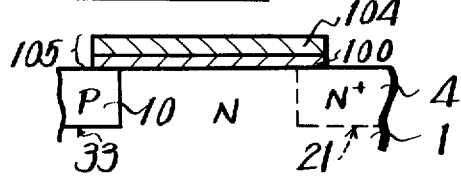

As shown in FIG. 4, this example has the following conditions in addition to the above conditions 1-1 to 1-9.

4-1. This example has a multi-insulating layer 105 consisting of the insulating layer 100 and another insulating layer 104 formed on the former by chemical vapor deposition (C V D).

As the insulating layer 104 formed by the CVD, SiO$_2$, Si$_3$N$_4$, Al$_2$O$_3$ or the like may be used. Since these layers can be formed at low temperature as compared with the thermal oxidation method, they have no influence upon the region before forming the emitter region 1 by the epitaxial growth, especially the base region 2, and hence a thick insulating layer can be formed.

4-2. Positive ions may be contained in the multi-insulating layer 105 or the boundary plane between the insulating layers 100 and 104 thereof.

The above condition 4-2 achieves the same effect as that of Examples 2 and 3.

The above Examples 2, 3 and 4 can be applied to the following Examples.

EXAMPLE 5

As shown in FIG. 5, this Example has the following conditions in addition to the above conditions 1-1 to 1-9.

5-1. The base electrode 8 connected to the high impurity concentration region 5 for the base extends over the low impurity concentration emitter region 1 through the insulating layer 100 and entirely covers the emitter junction 31 exposed to the major surface of the semiconductor substrate.

5-2. The same base electrode 8 extends over the low impurity concentration collector region 3 through the insulating layer 100 and entirely covers the collector junction 32 exposed to the major surface of the semiconductor substrate.

According to the above conditions, since the base electrode 8 is formed as an extended electrode, the insulating layer 100 and the low impurity concentration emitter region 1 are further protected and also the high withstanding voltage characteristics are presented. This protection effect is preferred for the bias-temperature treatment which is necessary for manufacturing the element.

When the emitter region 1 and the collector region 3 are used reversely, the similar effect can be obtained. In this case, the distance between the L-H junction 23 in the region 3 and the PN junction 32 is, of course, selected smaller than the diffusion length of the minority carriers in the region 3 similar to the distance between the L-H junction 21 and the PN junction 31, and the potential barrier due to the L-H junction 23 is selected more than the energy of the minority carriers or at least heat energy.

EXAMPLE 6

As shown in FIG. 6, this example has the following conditions in addition to the above conditions 1-1 to 1-9.

6-1. The emitter electrode 7 extends over the low impurity concentration emitter region 1 through the insulating layer 100 and entirely covers the L-H junction 21 in the emitter region 1 or that exposed to the major surface of the semiconductor substrate.

6-2. The emitter electrode 7 overlies the insulating layer 100 and all the low impurity concentration emitter region 1 portions which reach the surface including the surface ends of the L-H junction. The electrode 7 does not need to cover the N emitter region beneath the P region because the top surface of the N emitter is the portion to be stabilized by the insulator and the extending electrode.

Due to the condition 6-1, the L-H junction 21 is protected to be stable, the bounding of the emitter electrode 7 becomes advantageous and a great current can be applied thereto. The conductive layer covering the L-H junction is effective, especially during the bias-temperature treatment. When the treatment at high temperature is carried out with the respective electrodes being supplied with predetermined biases, if there is no conductive layer, strong electric fields are established in the L-H junctions 21, 22 and 23, electric charges are attracted by the L-H junctions from the outside, and the electric charges may remain as they are. As a result, the L-H junctions, especially the L-H junction 21 in the emitter region affects the current amplification factor $H_{FE}$ badly to make the same unstable.

Further, the effect of the condition 6-1 is further emphasized by the condition 6-2.

EXAMPLE 7

This example relates to the shape or configuration of the emitter. That is, as shown in FIG. 7 (which corresponds to the cross-section on the line D-D in FIG. 6), this example has the following conditions in addition to the foregoing conditions 1-1 to 1-9.

7-1. The PN junction 31 formed by the low impurity concentration emitter region 1 and the high impurity concentration region 5 for the base is shaped to have a corrugation.

7-2. The L-H junction 21 formed by the low impurity concentration emitter region 1 and the high impurity concentration region 4 for the emitter is shaped to have a corrugation along the corrugation of the PN junction 31 in the condition 7-1.

EXAMPLE 8

This example relates also to the shape of the emitter. That is, as shown in FIG. 8 (which corresponds to the cross-section on the line D—D in FIG. 6), this example has the following conditions in addition to the conditions 1-1 to 1-9.

8-1. The emitter region 1 is divided into a plurality of sections.

8-2. The high impurity concentration region 5 for the base is formed in the areas defined by the divided sections of the emitter region 1.

8-3. The high impurity concentration region 4 for the emitter is also divided into a plurality of sections.

In the above Examples 7 and 8, the emitter currents can be increased uniformly and the base resistance $\gamma_{bb}'$ can be decreased, so that these Examples may be used as a power transistor. Further, the high impurity concentration region 4 at the center, where current concentration is apt to occur upon large current, is omitted but shaped as a doughnut shape to disperse the current around the periphery thereof.

EXAMPLE 9

This example relates to the impurity concentration in the emitter region. As shown in FIG. 9, this example has the following conditions in addition to the above conditions 1-1 to 1-9.

9-1. The impurity concentration in the low impurity concentration emitter region 1 is varied in the direction perpendicular to the emitter junction 31.

9-2. Especially, the impurity concentration at a part 11 between the emitter junction 31 and the P type additional region 10 substantially at the center is lower than those on the other parts (for example, $10^{15}$ atoms/cm$^3$)

9-3. In the low impurity concentration emitter region 1, substantially symmetric electric field is established to accelerate the minority carriers to the center of the emitter region 1.

With the just above example, as shown by the energy level diagram of FIG. 9E (on the cross-section on the line E—E in FIG. 9), the holes injected from the P type base region 2 and the P type additional region 10 into the emitter region 1 are accelerated to the central part 11, so that the hole density in the low impurity concentration emitter region 1 can be made flat quickly to improve the high speed or velocity characteristics of the transistor.

EXAMPLE 10

This example relates to the additional region. As shown in FIG. 10, this example has the following conditions in addition to the conditions 1-1 to 1-9.

10-1. The P type additional region 10 is embedded in the low impurity concentration emitter region 1.
10-2. The P type additional region 10 is contiguous to the high impurity concentration region 5 for the base.
10-3. The P type additional region 10 is formed of mesh to disperse the electron current $J_n$ from the high impurity concentration region 4 for the emitter and to pass the same through the parts surrounded by the mesh region 10.
10-4. As another example, the P type additional region 10 is located at the interface between the low impurity concentration emitter region 1 and the high impurity concentration region 4 for the emitter. With this condition, the emitter current flows more uniformly as compared with the case where the additional region 10 is merely embedded.
10-5. The P type additional region 10 is extruded to the collector region 3 to form a projection 10a.

The condition 10-5 allows the outermost periphery of the projection 10a together with the projection 2a of the base region 2 to cause the depletion layer to be expanded from the inside of the concave and convex portions of the low impurity concentration base region 3 to the outside thereof which substantially improves the withstanding voltage of the transistor.

EXAMPLE 11

This example relates also to the additional region and, as shown in FIG. 11, has the following conditions in addition to the conditions 1-1 to 1-9.

11-1. A second P type additional region 12 is formed in the low impurity concentration collector region 3 in opposed relation to the P type additional region 10.
11-2. The distance between the region 12 and the collector junction 32 is selected smaller than the diffusion length of the minority carriers as in the condition 1-8.
11-3. It may be possible that the second additional region 12 is electrically connected to the base region 2.

With this example, even in an inverse transistor in which the emitter and collector are connected inversely, the high current amplification factor $h_{FE}$ can be obtained and hence this example can be used as a symmetrical transistor.

EXAMPLE 12

This example relates to a multi-layer wiring and, as shown in FIG. 12, has the following conditions in addition to the conditions 1-1 to 1-9.

12-1. The emitter electrode 7 is made of conductive poly-crystalling silicon including an impurity.
12-2. The high impurity concentration region 4 for the emitter is formed by diffusing the impurity in the polycrystalline silicon to the single-crystalline silicon.
12-3. The electrode 7 of the polycrystalline silicon layer extends on the insulating layer 100 by the condition 1-6 and covers the upper portion of the low impurity concentration emitter region 1.
12-4. Similarly, the base electrode 8 made of polycrystalline silicon is superimposed on the emitter electrode 7 through the insulating layer 100 to cover the upper portion of the low impurity concentration emitter region 1.
12-5. On the electrode 7 made of polycrystalline silicon layer, there is coated a protective upper insulating layer 106 made of $SiO_2$ by the chemical vapor deposition method.

With this example, the contamination for the low impurity concentration emitter region 1 described in connection with the first example is prevented completely, and its manufacturing steps can be made simplified.

EXAMPLE 13

This example relates to a control electrode and, as shown in FIG. 13, has the following condition in addition to those 1-1 to 1-9.

13-1. On the L-H junction 21 of the emitter which is exposed to the major surface of the semiconductor substrate, there is formed through the insulating layer 100 to control electrode or so-called MIS type control electrode 13 which is supplied with a control signal $V_G$.

With this example, the energy band (level) structure of the part of the L-H junction 21 opposing the insulating layer 100 is varied to make the current amplification factor $h_{FE}$ variable.

EXAMPLE 14

This example relates also to the control electrode and, as shown in FIG. 14, has the following conditions in addition to those 1-1 to 1-9.

14-1. The gate electrode 13 is provided against the L-H junction 21 or low impurity concentration emitter region 1 through a multi-insulating layer 107 containing a thermal oxidation film.
14-2. The multi-insulating layer 107 is made of the thermal oxidation $SiO_2$ film 100 and a $Si_3N_4$ film 108 and the part corresponding to the electrode 13 is formed as a so-called MNOS structure. The electric charge caused by the tunnel current and so on is caught in the insulating layer 107.
14-3. Or in order to make the part corresponding to the electrode 13 as a MAOS structure, the thermal oxidation $SiO_2$ film 100 and an $Al_2O_3$ film 109 are used and the control electrode 13 is used as a memory electrode by the charge-capture.
14-4. In another way, by using the well known combination of polycrystalline silicon on the $SiO_2$ layer, the electrode 13 is formed as a silicon-gate control electrode structure. In this case, the polycrystalline silicon is electrically floated to capture the electric charge to be as a memory electrode.

With this example, the control electrode 13 is used as the memory electrode to memorize the high or low of the current amplification factor $h_{FE}$. Thus, a number of the memory electrodes are employed to form a memory circuit. Due to the electric charges in the insulating layer or silicon which produces the memory effect, the energy band structure in the vicinity of the surface of the low impurity concentration emitter region 1 is varied to change the movement of the minority carriers or the hole current $J_p$ therein with the result that the emitter injection efficiency $\gamma$ is varied. By way of example, if a high voltage is applied to the electrode 13 to inject the electron into the insulating layer or electric charge capture region made of silicon from the semiconductor, the surface of the N type low impurity concentration emitter region 1 may form a depletion layer or an inverse layer when its electric charge is great.

EXAMPLE 15

Figure 15:
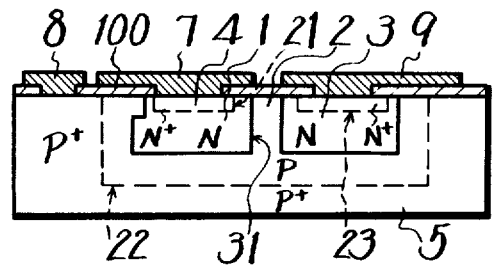

This example relates to a lateral structure transistor and, as shown in FIG. 15, has the following conditions in addition to those 1-1 to 1-9.

15-1. The low impurity concentration emitter region 1 and the low impurity concentration collector region 3 are located in the direction along the major surface of the semiconductor substrate.

15-2. The high impurity concentration region 4 in contact with the low impurity concentration emitter region 1 forms the L-H junction 21 apart from the emitter junction 31 by at least 1 micron.

15-3. The L-H junction 22 in the base region 2 is substantially parallel to the L-H junctions 21 and 23 in the emitter and collector regions 1 and 3.

EXAMPLE 16

Figure 16:
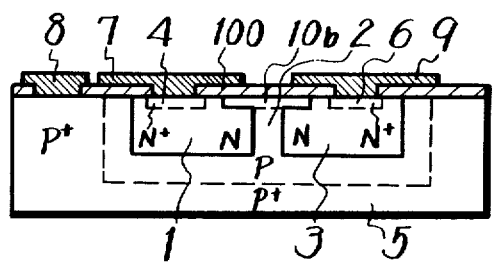

This example relates also to the transistor of lateral structure and, as shown in FIG. 16, has the following conditions in addition to those 1-1 to 1-9 and 15-1 to 15-3.

16-1. A P type additional region $10_b$ connecting to the base region 2 is formed.

16-2. The P type additional region $10_b$ is extended to the side of the emitter and collector regions 1 and 3 and is symmetrical.

The above Examples 15 and 16 are both the transistor of lateral type but can make their current amplification factor $h_{FE}$ high which is difficult in the prior art. Further, they can be used easily as the symmetrical transistor. In this case, the base can be formed by the ion implantation.

EXAMPLE 17

Figure 17:
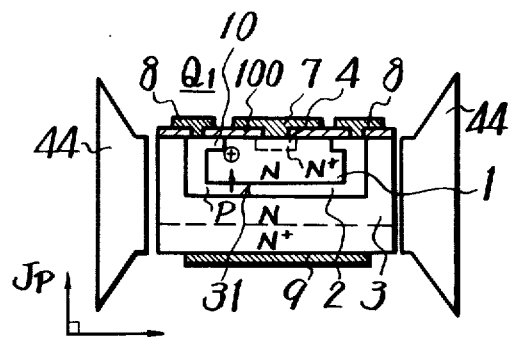

This example relates to a transducer and as shown in FIG. 17, has the following conditions in addition to those 1-1 to 1-9.

17-1. Means such as magnetic bodies 44 which produce a magnetic field parallel to the emitter junction 31 or perpendicular to the hole current $J_p$ are provided in the vicinity of a transistor $Q_1$. This example with the above condition is used with its emitter being grounded and its input side defects the magnetic field, so that it provides a magneto-sensitive element with high sensitivity. In this case, the hole current $J_p$ is changed in direction by the magnetic field and its change is delivered to the output side after being amplified.

17-2. It may be possible that a recombination region is formed partially in the low impurity concentration emitter region 1 by, for example, ion radiation and then the hole current $J_p$ from the base region 2 is recombined by a predetermined magnetic field to be quenched.

17-3. The P type additional region 10 is partial formed on the surface of the low impurity concentration region 1 and then the hole current $J_p$ from base 2 is effectively injected to the additional region 10 by the predetermined magnetic field.

Figure 18:
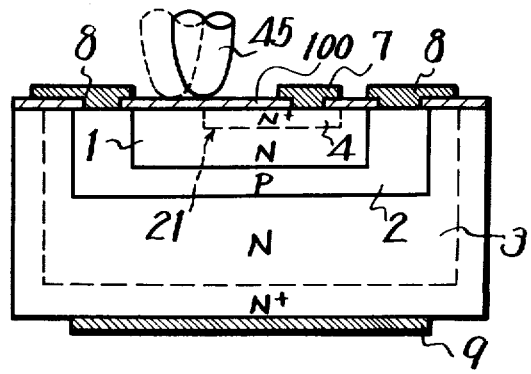

EXAMPLE 18 is disclosed in FIG. 18

This example has the following conditions in addition to those 1-1 to 1-9.

18-1. A pressure needle 45 is provided against the L-H junction 21 in the emitter region 1.

18-2. Or the pressure needle 45 is provided against the low impurity concentration emitter region 1.

With this example, the transistor is used with its emitter being grounded to provide a pressure sensitive element in which its input side detects the pressure and delivers the corresponding amplified output to its output side.

The reason why the impurity concentration is selected lower than $10^{19}$ atoms/cm$^3$ in the above conditions 1-1, 1-2 and 1-3 is that if the impurity concentration of the respective regions is selected more $10^{19}$ atoms/cm$^3$, the strain or dislocation of the crystal appears remarkably except that a specific atom is used. Further, the "diffusion length of minority carrier" in the conditions 1-6, 1-7 and 1-8 means the diffusion length which will be determined by the life time $\tau$ of the carriers in the region.

The above examples are the NPN type transistors but PNP type transistors are similarly presented.

The Examples 1 to 10 and 12–16 can be used a thrysistor and its $\alpha$ can be made high or controlled.

It will be apparent that many modifications and variations could be effected by one skilled in the art without departing from the spirits or scope of the novel concepts of this invention.

I claim as my invention:

1. A bipolar-type semiconductor device stabilized by an insulating layer formed on a semiconductor region having a low impurity concentration comprising:
   a first semiconductor region of one conductivity type consisting of a lightly doped region on one side and a heavily doped region on the other side and a junction between said lightly and heavily doped regions extending to the surface of the device;
   a second semiconductor region of the opposite conductivity type forming a first PN junction with said lightly doped region on said side;
   a third semiconductor region of said one conductivity type forming a second PN junction with said second region;
   an insulating layer covering at least the surface of said junction between lightly doped and heavily doped regions in said first region; and
   first, second and third electrodes contacting said first, second and third regions, respectively, in which said first electrode extends toward said second electrode on said insulating layer and covers an entire portion of said heavily doped region, and at least a part of said lightly doped region together with the said surface of the junction between lightly doped and heavily doped regions in said first region.

2. A bipolar-type semiconductor device stabilized by an insulating layer formed on a semiconductor region having a low impurity concentration comprising:
- an emitter region of one conductivity type including a lightly doped emitter region on a base side and a heavily doped emitter on the other side forming a lightly doped-heavily doped junction therebetween extending to the surface of the device;
- a base region of opposite conductivity type forming a first PN junction with said lightly doped emitter region;
- a collector region of said one conductivity type forming a second PN junction with said base region;
- an insulating layer formed on at least a part of said heavily doped emitter, said lightly doped emitter and said lightly doped-heavily doped junction at the surface of the device; said insulating layer being spaced from said first PN junction a distance shorter than the diffusion length of minority carriers in said lightly doped emitter; and
- electrodes for said emitter, base and collector; said electrode for said emitter extending on said insulating layer covering at least a part of said heavily doped emitter, said lightly doped emitter and said lightly doped-heavily doped junction at the surface of the device.

3. A bipolar-type semiconductor device stabilized by an insulating layer formed on a semiconductor region having a low impurity concentration comprising:
- an emitter region of one conductivity type including a lightly doped emitter region on a base side and a heavily doped emitter on the other side forming a lightly doped-heavily doped junction therebetween extending to the surface of the device; said junction being comb-shaped;
- a base region of opposite conductivity type forming a first PN junction with said lightly doped emitter region; said first PN junction being comb-shaped to match the comb shape of said lightly doped-heavily doped junction;
- a collector region of said one conductivity type forming a second PN junction with said base region;
- an insulating layer formed on the surface of at least a part of said heavily doped emitter, said slightly doped emitter and said lightly doped-heavily doped junction; said insulating layer being located from said first PN junction within the distance shorter than the diffusion length of minority carriers in said lightly doped emitter; and
- electrodes for said emitter, base and collector.

4. A bipolar-type semiconductor device stabilized by an insulating layer formed on a semiconductor region having a low impurity concentration comprising:
- a first semiconductor region of one conductivity type including a lightly doped-heavily doped junction therein extending to the surface of the device;
- a second semiconductor region of the opposite conductivity type forming a first PN junction with the lightly doped region of said first region;
- a third semiconductor region of said one conductivity type forming a second PN junction with said second region;
- an insulating layer covering at least said lightly doped region of the said first region at the surface of the device; and
- electrodes contacting said first region, said second region and said third region respectively, in which an electrode contacting said first region extends on said insulating layer and covers at least said lightly doped-heavily doped junction beneath said insulating layer.

5. A bipolar-type semiconductor device stabilized by an insulating layer formed on a semiconductor region having a low impurity concentration comprising:
- a first semiconductor region of one conductivity type consisting of a lightly doped region on one side and a heavily doped region on the other side forming a junction extending to the surface of the device;
- a second semiconductor region of the opposite conductivity type forming a PN junction with said lightly doped region on said side;
- a third semiconductor region of said one conductivity type forming a second PN junction with said second region;
- an insulating layer covering at least a surface of said lightly doped and said heavily doped region in said first region; and
- first, second and third electrodes contacting said first, second and third region respectively, said first electrode comprising a conductive polycrystalline silicon contacting said heavily doped region.

6. A bipolar-type semiconductor device stabilized by an insulating layer formed on a semiconductor region having a low impurity concentration comprising:
- a first semiconductor region of one conductivity type consisting of a lightly doped region on one side and a heavily doped region on the other side forming a junction extending to the surface of the device;
- a second semiconductor region of the opposite conductivity type forming a first PN junction with said lightly doped region on said side;
- a third semiconductor region of said one conductivity type forming a second PN junction with said second region;
- an insulating layer covering at least a surface of said lightly doped and said heavily doped region in said first region and a surface end of said first PN junction; and
- first, second and third electrodes contacting with said first, second and third regions respectively, in which said second electrode extends toward said first electrode on said insulating layer and covers an entire surface portion of said first PN junction and at least a part of said lightly doped region.

7. A bipolary-type semiconductor device stabilized by an insulating layer formed on a semiconductor region having a low impurity concentration comprising:
- a first semiconductor region of one conductivity type consisting of a lightly doped region on one side and a heavily doped region on the other side forming a junction extending to the surface of the device;
- a second semiconductor region of the opposite conductivity type forming a first PN junction with said lightly doped region on said side;
- a third semiconductor region of said one conductivity type forming a second PN junction with said second region;
- an insulating layer covering at least a surface of said lightly doped and said heavily doped region in said first region; said insulating layer including electric charged therein to change the condition of said surface of said lightly doped region; and
- first, second and third electrodes contacting with said first, second and third regions respectively, in which said first electrode extends toward said second electrode on said insulating layer and covers an entire surface portion of said heavily doped region and at least a part of said lightly doped region.

* * * * *